United States Patent [19]

Villaneuva, III et al.

[11] Patent Number: 5,001,603

[45] Date of Patent: Mar. 19, 1991

[54] HOUSING ASSEMBLY WITH SUBSTANTIALLY SPHERICAL SUPPORTS

[75] Inventors: Jose Villaneuva, III, Deerfield Beach; James H. Curtis, Coral Springs; Victor Poliarny, Plantation, all of Fla.

[73] Assignee: Motorola, Inc., Schaumburg, Ill.

[21] Appl. No.: 558,377

[22] Filed: Jul. 27, 1990

[51] Int. Cl.⁵ .............................. H05K 5/00
[52] U.S. Cl. .................... 361/394; 361/331; 361/380; 361/395; 361/399; 248/615; 248/677
[58] Field of Search .................. 248/188.9, 615, 677; 361/331, 380, 392, 394, 395, 399; 312/243, 250, 265; 364/708; 320/2

[56] References Cited

U.S. PATENT DOCUMENTS

| | | | |
|---|---|---|---|
| 943,342 | 12/1909 | Dubisee | 248/615 |
| 2,225,093 | 12/1940 | Avery | 248/615 |
| 2,770,851 | 11/1986 | Angelica et al. | 248/188.9 |

Primary Examiner—Leo P. Picard
Assistant Examiner—Michael W. Phillips
Attorney, Agent, or Firm—Daniel K. Nichols

[57] ABSTRACT

A housing assembly 100 which uses substantially spherical pieces (rubber balls) 106 for supports (feet). The balls 106 drop into the bottom housing member 104 which has apertures 202 which allow the balls 106 to rest. Each of the balls 106 protrude from the bottom portion of the housing. Preferably, each of the aperatures 202 have a peripheral wall 402 around them which surround and capture each of the balls (stop the balls from rolling during the assembly process). Preferably, an electronic circuit board 310 is sandwiched between the rubber balls and the top housing member 102. The two housing members 102 and 104 are then latched together causing the balls 106 to compress and load the housing assembly, taking care of any tolerances the mechanical parts in the assembly may have and also hold the electronic circuit board 310 in place.

14 Claims, 2 Drawing Sheets

HOUSING ASSEMBLY WITH SUBSTANTIALLY SPHERICAL SUPPORTS

TECHNICAL FIELD

This invention relates generally to housing assemblies utilizing feet (or supports), and particularly to housing assemblies with substantially spherical feet, and is more particularly directed to an energy source charging device with substantially spherical feet.

BACKGROUND

Many housing or mechanical assemblies have feet or supports made out of rubber, plastic, or other well known materials. For example, many electronic devices such as energy source charging devices (battery chargers) use rubber feet for support. Most of these feet are attached to the housing assembly by way of pressure sensitive adhesives, screws, rivets or molded split grommets that attach to apertures in the housing.

The problems associated with the above mentioned methods of attaching feet to housing assemblies are numerous. Normally they require more parts to assemble and thus are normally more expensive to build. They also require more labor time to assemble since normally the feet require mechanical orientation in the assembly process. Accordingly, there is a need in the art for a housing assembly utilizing feet which minimizes parts in the assembly and require little or no mechanical orientation during the assembly process.

SUMMARY OF THE INVENTION

Briefly, according to the invention, a housing is comprised of top and bottom housing members with the bottom housing having apertures which allow substantially spherical members (balls), to "drop in" during assembly. Preferably, each of the apertures have a peripheral wall around them in order to capture the balls during assembly so that the rubber balls do not roll out before the top housing is attached. In the preferred embodiment, an electronic circuit board is placed between the rubber balls and the top housing. Once the two housing members are coupled together, the balls are compressed which "loads" the assembly and compensates for any mechanical tolerances that the mechanical parts may have.

DETAILED DESCRIPTION OF THE PREFERRED EMBODIMENT

Figure 1:
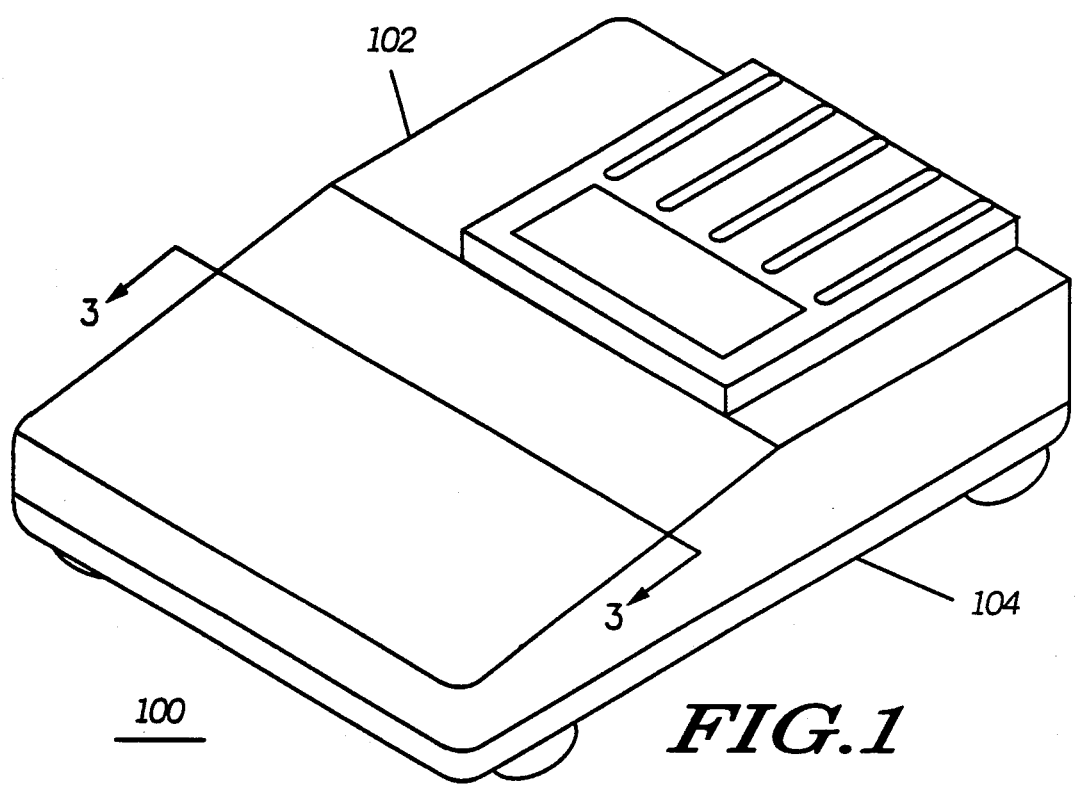
FIG. 1 shows a perspective view of a housing assembly according to the present invention.

Referring to the drawings and in particular to FIG. 1 a housing assembly for an energy source charging device (battery charger) 100 in accordance with the present invention is shown. Which includes a bottom housing 104, and a top housing 102. Although the housing of FIG. 1 is illustrated as a desk top battery charger for portable radios, those skilled in the art will appreciate that the housing assembly 100 can be for any device, and can take numerous shapes and sizes. The housing is preferably made out of plastic such as MACKROBLEND UT-400 RESIN ™, manufactured by Mobay, Inc.

Figure 2:
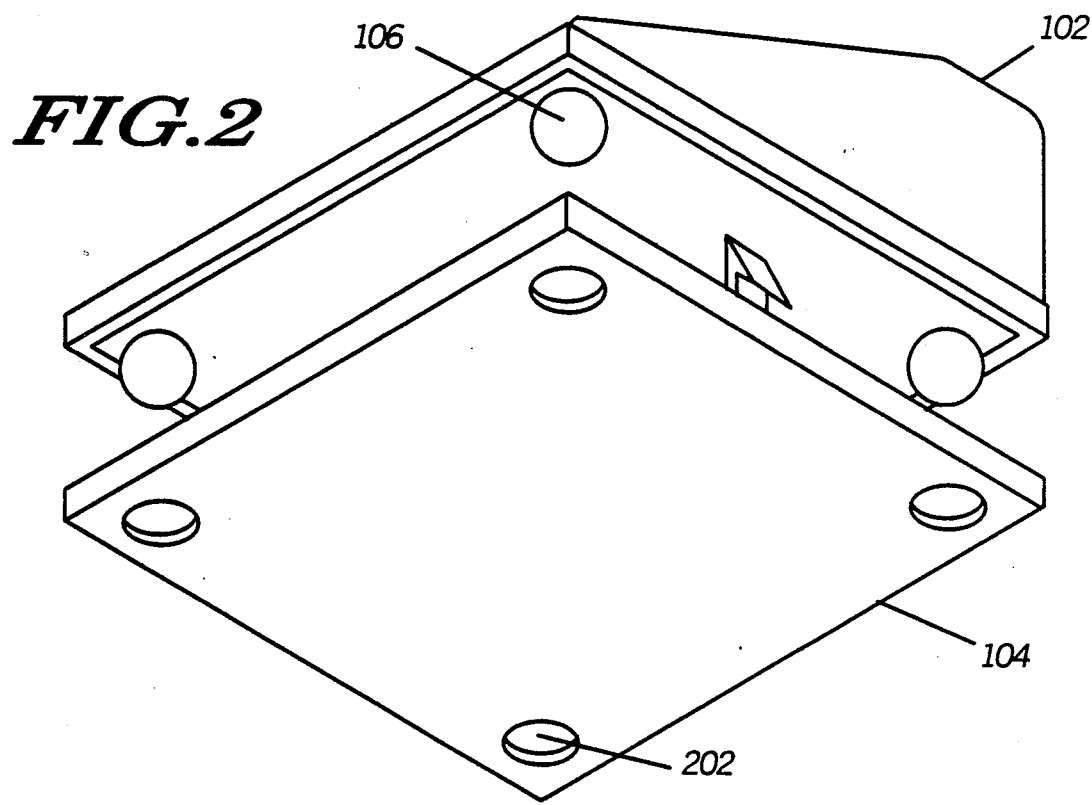
FIG. 2 is a bottom view of the housing assembly of FIG. 1 with parts broken away.

FIG. 2 shows a bottom view of the housing assembly 100 with parts broken away, which shows a substantially spherical member or ball 106, preferably made out of Ethylene Propylene Rubber (EPDM elastomer) having a nominal diameter of 0.5 inches. Though the balls 106 are preferably substantially spherical, other shapes such as oval, elongated, etc. will work with the present invention. The major benefit of using spherical balls 106 is that they do not require orientation during assembly. The balls 106 should preferably be resilient and have a shore durometer (hardness) of approximately 60. In the preferred embodiment each aperture 202 has a nominal diameter of 0.422 inches. Those skilled in the art will appreciate that though the apertures 202 have been shown in the bottom housing 104, they could be anywhere in the housing assembly 100 which requires external feet or supports (i.e. top, sides, etc.). In the preferred embodiment the housing has four balls 106 one at each corner of the bottom housing 104 as well as four apertures 202 on the bottom housing member 104.

Figure 3:
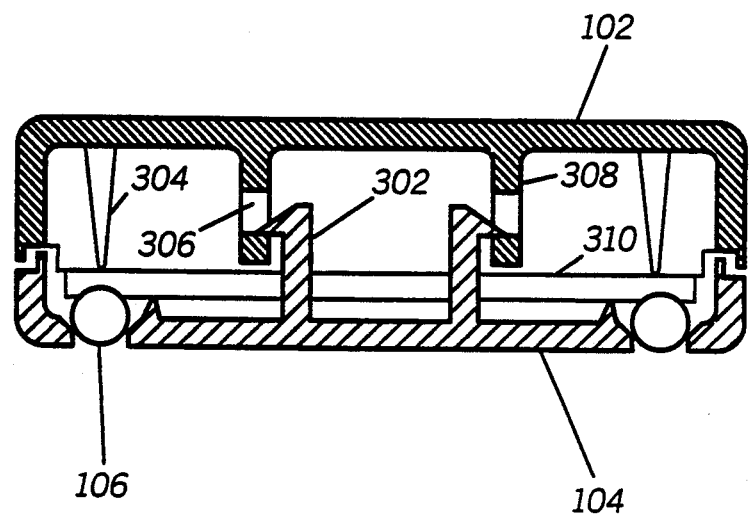
FIG. 3 is a cross-sectional view of the housing assembly taken on line 3—3 of FIG. 1.

Referring to FIG. 3, a cross-sectional view of the housing assembly 100 taken on line 3—3 of FIG. 1. Shown is circuit board 310 preferably an electronic circuit board. Electronic circuit board 310 can be placed between the top housing 102 and the balls 106. Also shown in FIG. 3 are the means for coupling the top and bottom housing members, preferably by use of resilient snaps 302 extending from the bottom housing 104. The snaps 302 latch into retainers 306 which are located on housing extension members 308, which extend from the top housing 102. In the present embodiment, the housing assembly 100 has four snaps 302 and four retainers 306. Those skilled in the art will appreciate that the number of snaps 302 and retainers 306 required will depend on the size and shape of the housing assembly 100, with larger assemblies requiring more sets of snaps 302 and retainers 306. FIG. 3. also shows the ball 106 protruding through the aperture 202 to form a bearing surface. Preferably, the balls 106 will nominally protrude 0.09 inches from the bottom housing 104, forming supports for the housing assembly 100. The top housing 102 retains the balls 106, in place by way of ribs 304 which extend down from the top housing 102 and apply pressure to the circuit board 310, which in turn, compress the resilient balls 106. Once the housing is latched, the compression of the balls 106 creates a force inside of the housing assembly against the circuit board 310 which in turn pushes up on the ribs 304 of the top housing 102. The balls 106 also exert a force against the bottom housing 104. Since the balls stay in a compressed state inside the housing assembly 100 they in turn mechanically load the housing assembly 100, since preferably the balls 106 are resilient. By designing all the parts of the housing assembly 100 (i.e. balls, housings, circuit board, etc.) with some mechanical interference built in that is smaller than the maximum compression of the balls 106, one can load the housing assembly 100, and compensate for any play in the assembly due to part tolerances. In the preferred embodiment, the housing assembly 100 has a nominal mechanical interference tolerance of 0.030 inches for all the housing parts. While the housing assembly 100 was designed for a nominal interference of 0.033 inches. Therefore, the minimum statistical interference of the preferred embodiment assembly could be 0.003 inches and the maximum 0.063 inches. In other words, preferably the balls 106 will be compressed a minimum 0.003 to the maximum would be 0.063 inches. The resilience of the balls 106, compensate for the interference built up inside the housing assembly 100.

Figure 4:
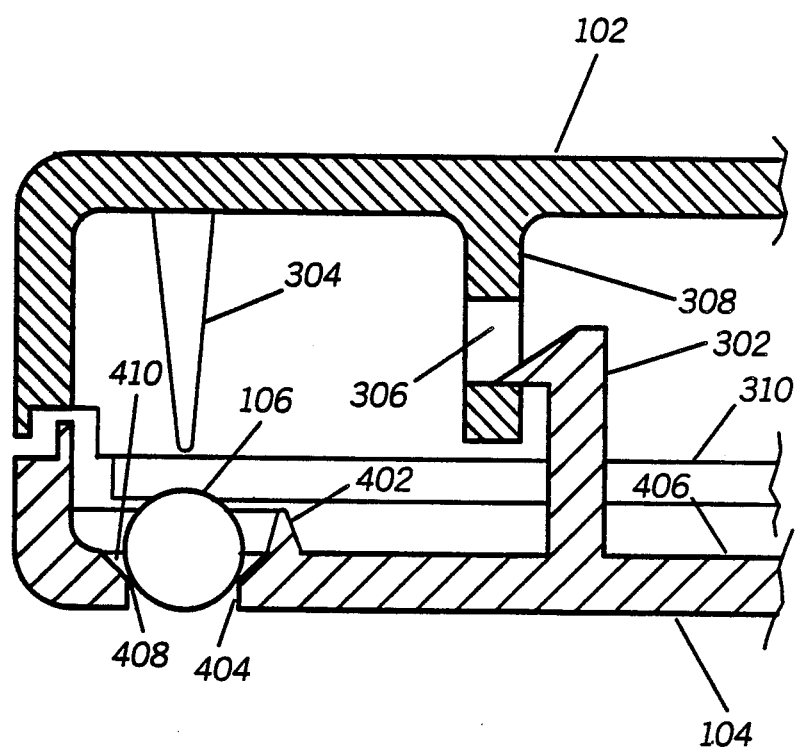
FIG. 4 is a partial exploded cross-sectional view of the housing assembly of FIG. 3.

FIG. 4 is a partial exploded cross sectional view of the housing assembly 100 of FIG. 3, with the top housing 102 and the bottom housing 104 latched together. A cross section of a peripheral wall 402 is shown, which surrounds the aperture 202. The peripheral wall 402 captures the balls 106 when they are placed during assembly, to keep them from rolling away prior to attachment of the top housing 102. Preferably, the wall 402 will extend nominally 0.20 inches higher then the inside part of the bottom housing 406. The thickness of the bottom housing 404 around the aperture 202 is also shown in FIG. 5. Preferably, the thickness of the bottom housing 404 around the aperture 202 is nominally 0.03 inches thick. The points at which the balls 106 touch the inside part of the bottom housing 406, are the seats 408. The inside wall of the bottom housing 406 has an angled inner wall 410 to the seat 408, in order for the balls 106 not to interfere with the inside wall. This angled inner wall 410 will accommodate the expansion of the balls 106 when they become compressed. Preferably, the angle of the angled inner wall 410 to the seat 408 can be any angle which does not interfere with the balls 106 when they rest upon the bottom housing 104, preferably 30 degrees.

The housing as described above is easily assembled by placing one ball 106 into each of the apertures 202, then placing an optional circuit board 310 on top of the balls 106. The top housing 102 is placed next on top of the bottom housing 104, and the housings snap fitted together when pressed towards each other, which also causes the balls 106 to be retained. When pressing the top and bottom housings together, the portion of the balls 106 which protrude out of the bottom housing 104 and form the bearing surfaces, should not be in contact with any surface. Since, when the two housings are being coupled together the balls 106 will be compressed and generate an outwardly force through the aperture 202.

While only certain preferred features of the invention have been shown by way of illustration, many modifications and changes will occur to those skilled in the art. It is, therefore, to be understood that the present claims are intended to cover all such modifications and changes which fall within the true spirit of the invention.

What is claimed is:

1. A housing assembly comprising: a first housing member having an aperture; a substantially spherical resilient member with a section protruding through the aperture forming a bearing surface; and a means for retaining the substantially spherical resilient member; said retaining means comprising a second housing member.

2. A housing assembly as defined in claim 1, wherein the retaining means further includes a circuit board between the second housing member and the substantially spherical resilient member.

3. A housing assembly as defined in claim 2, wherein the first and second housing members are coupled together causing the substantially spherical resilient member to compress and load the housing assembly.

4. A housing assembly as defined in claim 1, wherein the housing member includes a substantially peripheral wall around the aperture, in order to capture the substantially spherical resilient member.

5. A housing assembly as defined in claim 4, wherein the retaining means further includes a circuit board between the second housing member and the substantially spherical resilient member.

6. A housing assembly as defined in claim 5, wherein the first and second housing members are coupled together causing the substantially spherical resilient member to compress and load the housing assembly.

7. An energy source charging device, comprising:
a housing member having a plurality of apertures;
a plurality of substantially spherical resilient members each having a section protruding through one of the apertures to form bearing surfaces; and
a second housing member for retaining the substantially spherical resilient members.

8. An energy source charging device as defined in claim 7, further including a circuit board between the second housing member and the substantially spherical resilient members.

9. An energy source charging device as defined in claim 8, wherein the first and second housing members are coupled together causing the substantially spherical resilient members to compress and load the housing assembly.

10. An energy source charging device as defined in claim 7, wherein the housing member includes a substantially peripheral wall around each of the apertures, in order to capture the substantially spherical resilient members.

11. A method for assembling a housing, comprising the steps of: placing a substantially spherical resilient member into a first housing member having an aperture with a section of the substantially spherical resilient member protruding through the aperture to form a bearing surface; coupling a second housing member to the first housing member to retain the substantially spherical resilient member.

12. A method as defined in claim 11, wherein an electronic circuit board is positioned between the second housing member and the substantially spherical resilient member prior to coupling the housing members.

13. A method as defined in claim 12, wherein the step of coupling the first and second housing members causes the substantially spherical resilient member to compress and load the housing assembly.

14. A method as defined in claim 13, wherein the first housing member includes a substantially peripheral wall around the aperture, in order to capture the substantially spherical resilient member.

* * * * *